(12) United States Patent
Kimura et al.

(10) Patent No.: US 8,355,244 B2
(45) Date of Patent: Jan. 15, 2013

(54) ELECTRIC POWER CONVERTER

(75) Inventors: Mitsunori Kimura, Oobu (JP);
Yukitoshi Narumi, Kariya (JP); Masaya Tonomoto, Oobu (JP)

(73) Assignee: Denso Corporation, Kariya (JP)

( * ) Notice: Subject to any disclaimer, the term of this patent is extended or adjusted under 35 U.S.C. 154(b) by 297 days.

(21) Appl. No.: 12/759,971

(22) Filed: Apr. 14, 2010

(65) Prior Publication Data
US 2010/0259898 A1    Oct. 14, 2010

(30) Foreign Application Priority Data
Apr. 14, 2009    (JP) ................................ 2009-097559

(51) Int. Cl.
*H05K 7/20* (2006.01)
(52) U.S. Cl. ........ 361/676; 361/624; 361/688; 361/715; 361/763; 361/831; 62/259.2; 257/707; 257/719; 363/141
(58) Field of Classification Search .................. 361/601, 361/624, 647, 648, 676, 688, 704, 707, 712, 361/715, 763, 821, 830, 831
See application file for complete search history.

(56) References Cited

U.S. PATENT DOCUMENTS

| | | | | |
|---|---|---|---|---|
| 2005/0259402 A1* | 11/2005 | Yasui et al. | ................... | 361/716 |
| 2006/0174642 A1* | 8/2006 | Nagashima et al. | ......... | 62/259.2 |
| 2006/0243422 A1* | 11/2006 | Sakai et al. | ................... | 165/80.4 |
| 2007/0165376 A1* | 7/2007 | Bones et al. | ................... | 361/688 |
| 2007/0253164 A1* | 11/2007 | Matsuo et al. | ................ | 361/699 |
| 2008/0130223 A1* | 6/2008 | Nakamura et al. | ............ | 361/689 |
| 2009/0231811 A1* | 9/2009 | Tokuyama et al. | ........... | 361/699 |
| 2010/0244585 A1* | 9/2010 | Tan et al. | ....................... | 307/109 |
| 2010/0315780 A1* | 12/2010 | Murakami | ..................... | 361/699 |

FOREIGN PATENT DOCUMENTS

| | | |
|---|---|---|
| JP | 2001-230145 | 8/2001 |
| JP | 2002-016202 | 1/2002 |
| JP | 2004-296958 | 10/2004 |
| JP | 3646049 | 2/2005 |
| JP | 2007-089258 | 4/2007 |
| JP | 2008-061282 | 3/2008 |
| JP | 2008-113511 | 5/2008 |
| JP | 2008-148530 | 6/2008 |
| JP | 2008-253057 | 10/2008 |

OTHER PUBLICATIONS

Japanese Office Action dated Feb. 22, 2011, issued in corresponding Japanese Application No. 2009-097559 with English Translation.

* cited by examiner

*Primary Examiner* — Courtney Smith
(74) *Attorney, Agent, or Firm* — Nixon & Vanderhye PC

(57) ABSTRACT

An electric power converter has a semiconductor module having a semiconductor element integrally and at least a pair of semiconductor terminals, a capacitor electrically connected to the semiconductor module, and a cooler that thermally contacts to at least one of a plurality of capacitor terminals provided in the capacitor. The capacitor terminals that thermally contact the cooler are arranged between the cooler and the capacitor.

9 Claims, 18 Drawing Sheets

ELECTRIC POWER CONVERTER

CROSS-REFERENCE TO RELATED APPLICATION

This application is based on and claims the benefit of priority from earlier Japanese Patent Application No. 2009-97559 flied Apr. 14, 2009, the description of which is incorporated herein by reference.

BACKGROUND OF THE INVENTION

1. Technical Field of the Invention

This invention relates to an electric power converter that has a semiconductor module having an integral semiconductor element and a capacitor connected to the semiconductor module.

2. Description of the Related Art

Electric power converters such as an inverter and a converter convert electric power by switching operation of a plurality of semiconductor elements.

In such an electric power converter, a capacitor that smoothes the current supplied to a semiconductor module from a direct-current power supply is electrically connected to the semiconductor module.

The electric power converter having the capacitor and the semiconductor module being connected via a bus bar is disclosed in Japanese Patent Application Laid-Open Publication No. 3646049.

However, the heat that is generated in the semiconductor module will be transferred to the capacitor through a terminal area and the bus bar in the conventional electric power converter mentioned above.

Thereby, there is a possibility that the temperature of the capacitor may become high and the capacitor may be deteriorated.

In particular, when the controlled current of the electric power converter has a high current density, the heat generation of the semiconductor module tends to become large.

In addition, with a raise in a heat resistance of the semiconductor element, the semiconductor element tends to be used at higher temperature.

Under this situation, even if the heat resistance of the semiconductor module is fully secured, the present condition is that the heat resistance of the capacitor is not fully secured.

Therefore, degradation of the capacitor by heat received from the semiconductor module in the electric power converter is an important subject in recent years.

SUMMARY OF THE INVENTION

The present invention has been made in order to solve the issue described above, and has as its object to provide an electric power converter that reduces a temperature rise in a capacitor.

In an electric power converter according to a first aspect, the electric power converter comprises a capacitor electrically connected to an electronic component that contains a semiconductor element therein, and a cooler is in thermal contact with the electronic part.

At least one of a plurality of capacitor terminals provided in the capacitor is arranged between the cooler and the capacitor.

Preferably, the electronic component is either a semiconductor module or a reactor.

The cooler contacts the capacitor terminals thermally. Thereby, heat generated by the capacitor terminals is suppressed, and the heat transfer from the semiconductor module to the capacitor can be suppressed, thus the temperature rise of the capacitor can be reduced.

The capacitor terminals are connected to the semiconductor terminals of the semiconductor module directly or via other terminals or conducting members etc.

In addition, since the capacitor raises its temperature by receiving the heat of the semiconductor module via both connecting portions, the heat of the semiconductor module can be transferred to the cooler before the capacitor receives the heat by thermally contacting the capacitor terminals, which is a heat-receiving path or at least a part of portion connected thermally to the path, to the cooler.

Therefore, the heat received at the capacitor can be suppressed and the rise in heat of the capacitor can be reduced.

Although the capacitor terminals self generate heat by the current that flows there, since the cooler touches the capacitor contacts thermally, the rise in heat of the capacitor terminals can also be suppressed.

Consequently, the temperature rise in the capacitor due to heat generated by the capacitor terminals can also be suppressed.

According to the present invention, as mentioned above, the electric power converter that reduces any temperature rise of the capacitor can be provided.

In the electric power converter according to a second aspect, the capacitor terminal that contacts the cooler thermally is a terminal connected to the semiconductor module or the reactor.

In the electric power converter according to a third aspect, the capacitor terminal that contacts the cooler thermally is a terminal connected to electronic components different from the semiconductor module or the reactor.

In the electric power converter according to a fourth aspect, the cooler contacts the semiconductor module or the reactor thermally.

In the electric power converter according to a fifth aspect, potting agents pack parts of the capacitor terminals together with a capacitor element, and the parts of the capacitor terminals thermally contact the cooler via the potting agent.

In the electric power converter according to a sixth aspect, at least a part of a pair of capacitor terminals is adjacent to each other.

In the electric power converter according to a seventh aspect, the cooler has a refrigerant passage that circulates a cooling medium therein.

In the electric power converter according to a eighth aspect, the cooler comprises a cooling pipe that has the refrigerant passage, and a heat sink that is arranged tightly contacting to the cooling pipe while not circulating the cooling medium therein.

In the electric power converter according to a ninth aspect, the semiconductor module or the reactor thermally contacts the cooling pipe, and at least one of the capacitor terminals touches the heat sink thermally.

In the electric power converter according to a tenth aspect, a part of the capacitor terminals, with the capacitor element, is surrounded by the potting agents, a part of the heat sink is laid under the potting agents, and a part of the capacitor terminals thermally contacts the heat sink via the potting agents.

DETAILED DESCRIPTION OF PREFERRED EMBODIMENTS

Preferred embodiments according to the present invention will be described with reference to the drawings.

In this invention, a term "thermal contact" means that a semiconductor terminal and a capacitor terminal are able to exchange heat with a cooler, and an occasion such as electrical insulation materials having thermal conductivity intervened therebetween is also included.

(First Embodiment)

Figure 1:
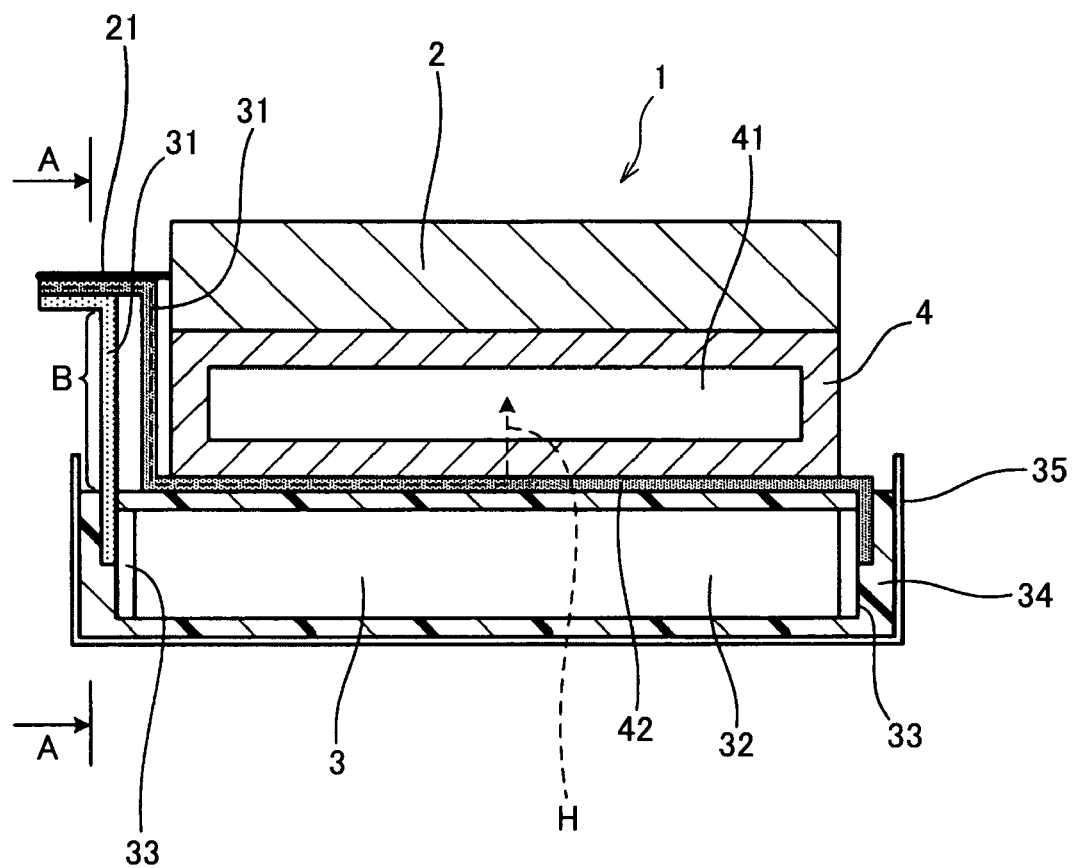
FIG. 1 shows a section diagram of an electric power converter in a first embodiment.
Figure 2:
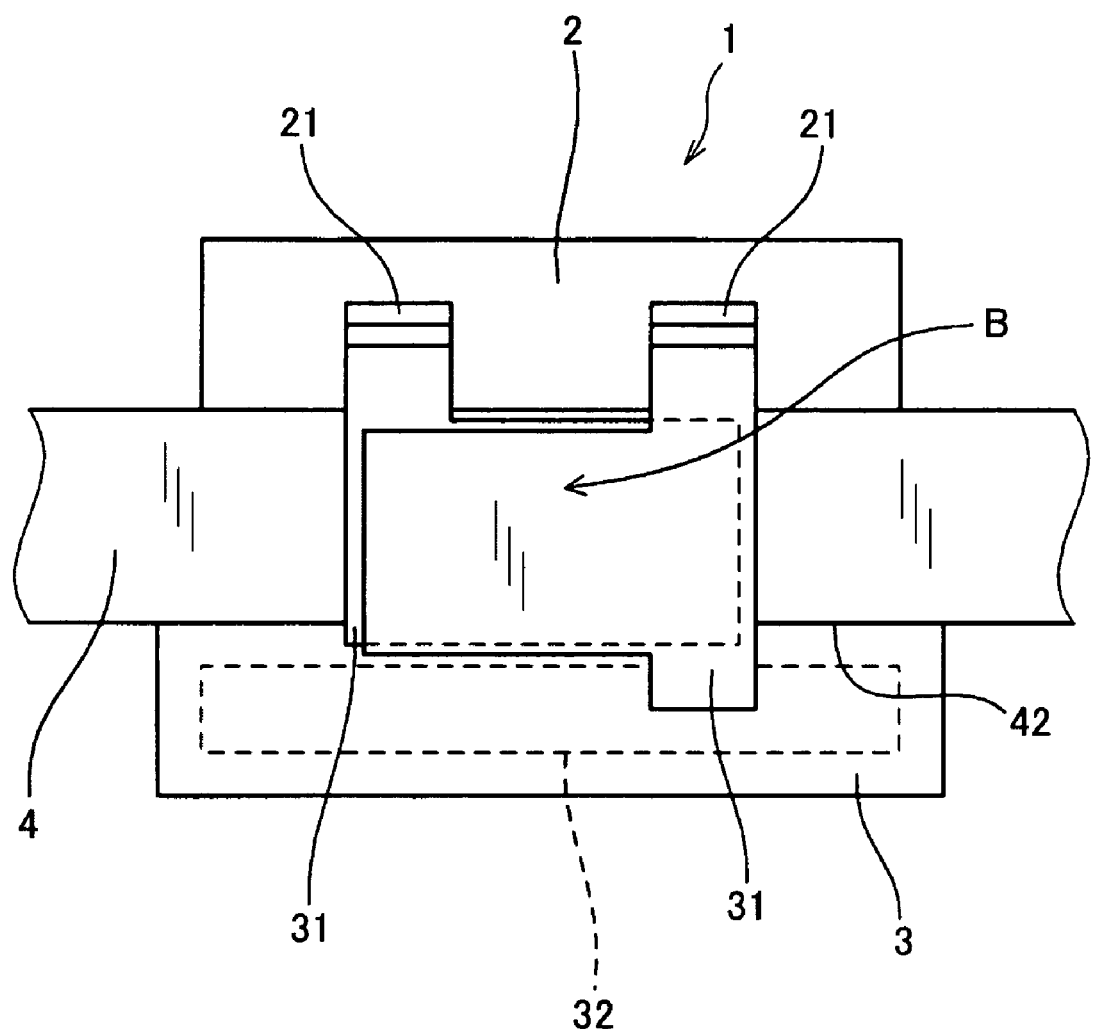
FIG. 2 shows a sectional view taken along the line A-A of FIG. 1.
Figure 3:
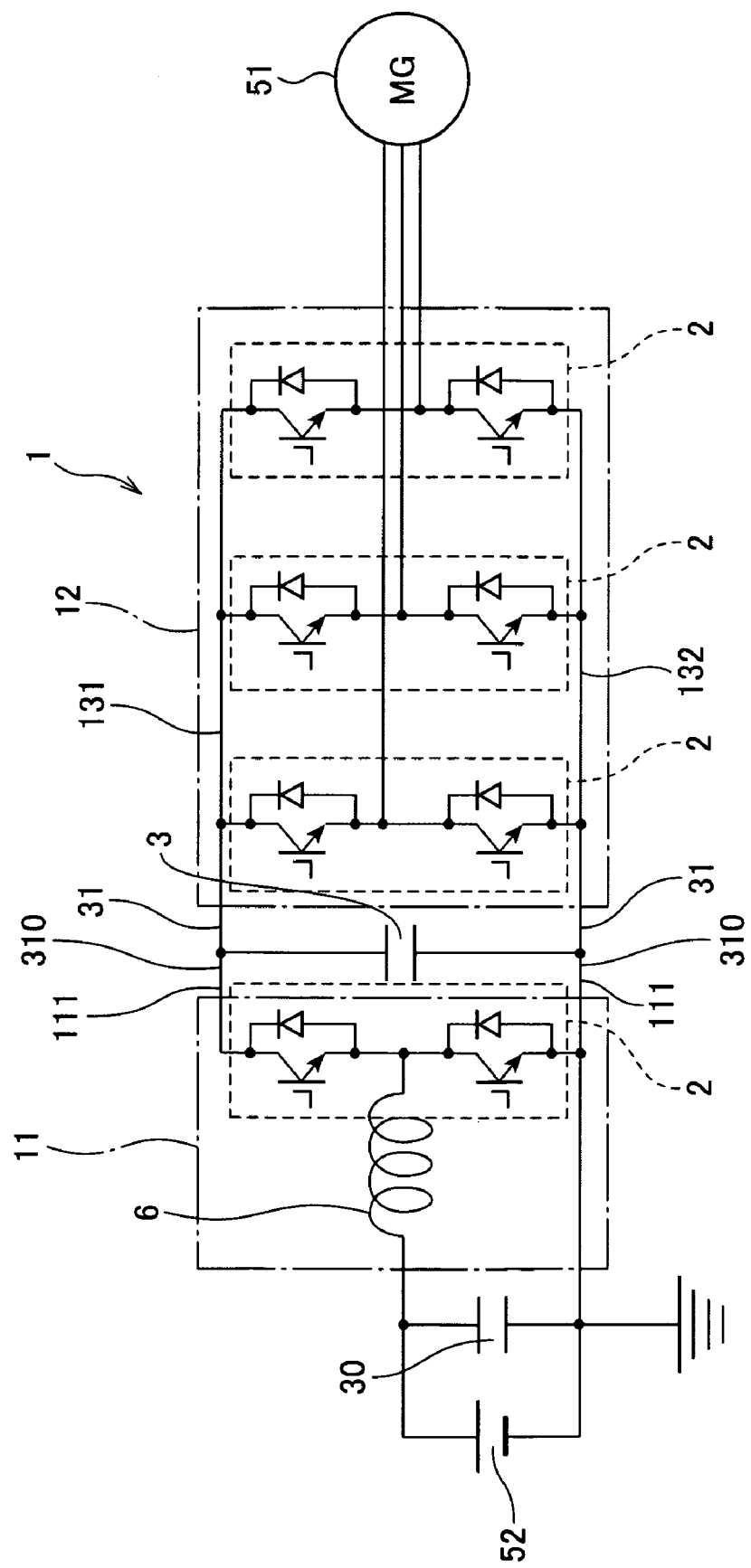
FIG. 3 shows a circuit diagram of the electric power converter in the first embodiment.

An electric power converter according to an embodiment of the present invention is explained using FIGS. 1-3.

As shown in FIGS. 1 and 2, the electric power converter 1 of this embodiment has an electronic component, a semiconductor module 2 in this embodiment, a capacitor 3, and a cooler 4. The semiconductor module has a semiconductor element integrally as well as at least a pair of semiconductor terminals 21. The capacitor 3 is electrically connected to the semiconductor module 2, while at least one of a plurality of capacitor terminals 31 provided in the capacitor 3 is contacted thermally to the cooler 4.

As shown in FIG. 1, the capacitor terminals 31, which contact the cooler 4 thermally, are arranged between the cooler 4 and the capacitor 3. The cooler 4 also contacts the semiconductor module 2 thermally. The capacitor terminals 31 contacting the cooler 4 thermally are the terminal connected to the semiconductor terminals 21.

The capacitor 3 has the capacitor element 32, a pair of electrodes 33, and the pair of capacitor terminals 31. The electrodes 33 are thermal sprayed portions formed in both ends of the capacitor element 32. The capacitor terminals 31 are connected to the electrodes 33. The capacitor element 32 is accommodated in a case 35 filled with potting agents 34 that holds the capacitor element 32 therein.

Parts of the capacitor terminals 31 are exposed to an exterior from the potting agents 34, and their tip parts are connected with the semiconductor terminals 21 of the semiconductor module 2.

A part of portion of one of the capacitor terminals 31 exposed from the potting agents 34 is arranged between the capacitor 3 and the cooler 4, and is surface-to-surface contacted thermally with a main side 42 of the cooler 4.

Between the cooler 4 and the capacitor terminals 31, there is intervened an insulation material (not shown) with an excellent thermal conductivity.

For the potting agents 34, a thermosetting resin that is excellent in thermal conductivity, such as an epoxy resin, for example, may be used.

Each part of the capacitor terminals 31 (area marked B in FIGS. 1 and 2) is adjacent to each other.

Each capacitor terminals 31 has a plate shape, and is arranged so that the main side is facing each other with a predetermined interval. This predetermined interval may be 0.6-3.0 mm.

An insulating paper etc. can also be intervened between the pair of capacitor terminals 31 arranged adjacent to each other and face-to-face.

The semiconductor module 2 is arranged on the main side 42 of the cooler 4 opposite to the side where the capacitor 3 is arranged. That is, a surface of the semiconductor module 2 where a heat radiation plate is formed is thermally contacted onto the main side 42 of the cooler 4.

At this time, an insulation material having an excellent thermal conductivity, such as a ceramic plate, heat radiation grease, etc. is arranged between the semiconductor module 2 and the cooler 4 if necessary.

A cooler 4 is made of metal or an alloy excellent in the thermal conductivity, such as aluminum or its alloy, and provided with a refrigerant passage 41 that circulates a cooling medium therein.

For the cooling medium, there are natural refrigerants, such as water and ammonia, water mixed with antifreeze solution made of ethylene glycol, fluorocarbon refrigerants, such as Fluorinert™, chlorofluocarbon refrigerants, such as HCFC123 and HFC134a, methanol, alcoholic refrigerants, such as a pure alcohol, and ketone refrigerants, such as an acetone, for example.

The electric power converter 1 of the present invention has the circuit structure shown in FIG. 3.

That is, the electric power converter 1 has an inverter part 12 that converts a direct-current electric power to an alternating current electric power or vice versa between a direct-current power supply 52 and electrical rotation machine 51 of a three phase alternating current, and a buck-boost converter 11 that boosts or lowers a direct-current voltage between the direct-current power supply 52 and the inverter part 12.

Between the inverter part 12 and the buck-boost converter 11, the capacitor 3 for smoothing the current supplied to the inverter part 12 is arranged. The inverter part 12 has a plurality of the semiconductor modules 2.

The arrangement of the semiconductor module 2 and the capacitor 3 in the electric power converter 1 is the above-mentioned arrangement (FIGS. 1 and 2).

The electric power converter 1 of this embodiment is used for the electric power conversion in power sources for an electric car and a hybrid car, for example.

Next, an operation and effect of the present embodiment are explained.

In the electric power converter 1, the cooler 4 contacts the capacitor terminals 31 thermally.

Thereby, heat generation of the capacitor terminals 31 is suppressed, and heat transfer from the semiconductor module 2 to the capacitor 3 can also be suppressed, thus the temperature rise in the capacitor 3 can be reduced.

The capacitor terminals 31 are directly connected with the semiconductor terminals 21 of the semiconductor module 2.

Since the capacitor 3 raises its temperature by receiving the heat of the semiconductor module 2 via both connecting portions, the heat of the semiconductor module 2 can be transferred to the cooler 4 before the capacitor 3 receives the heat by thermally contacting the capacitor terminals 31, which is a heat-receiving path or at least a part of portion connected thermally to the path, to the cooler 4.

Therefore, the heat receiving of the capacitor 3 can be suppressed and the rise in heat of the capacitor 3 can be reduced.

It should be appreciated that the movement of the heat that transfers from the semiconductor module 2 to the cooler 4 through the capacitor terminals 31 is expressed with a dashed line arrow H in FIG. 1. In other figures, the movement of heat is similarly expressed with the dashed line arrow H.

In addition, the cooler 4 contacts the capacitor terminals 31 thermally.

Thereby, heat transfer from the semiconductor module 2 to the capacitor 3 can be suppressed, thus the temperature rise in the capacitor 3 can be reduced.

The capacitor terminals 31 are directly connected with the semiconductor terminals 21 of the semiconductor module 2.

Since the capacitor 3 raises its temperature by receiving the heat of the semiconductor module 2 via both connecting portions, the heat of the semiconductor module 2 can be transferred to the cooler 4 before the capacitor 3 receives the heat by thermally contacting the capacitor terminals 31, which is a heat-receiving path or at least a part of portion connected thermally to the path, to the cooler 4.

Therefore, the heat receiving of the capacitor 3 can be suppressed and the rise in heat of the capacitor 3 can be reduced.

Although the capacitor terminals 31 self generate heat by the current that flows there, since the cooler 4 touches the capacitor contacts 31 thermally, the rise in heat of the capacitor terminals 31 can also be suppressed.

Consequently, the temperature rise in the capacitor 3 due to the receiving of the heat generated by the capacitor terminals 31 can also be suppressed.

Further, since the pair of capacitor terminals 31 is adjacent to each other, an inductance in the circuit formed between the semiconductor module 2 and the capacitor 3 can be reduced.

Thereby, the surge voltage resulting from switching operation of the semiconductor element can be reduced.

In addition, since the cooler 4 has the refrigerant passage 41 where the cooling medium circulates inside, the temperature rise in the capacitor 3 can be suppressed effectively.

According to the present embodiment, as mentioned above, the electric power converter that reduces the temperature rise of the capacitor can be provided.

(Second Embodiment)

Figure 4:
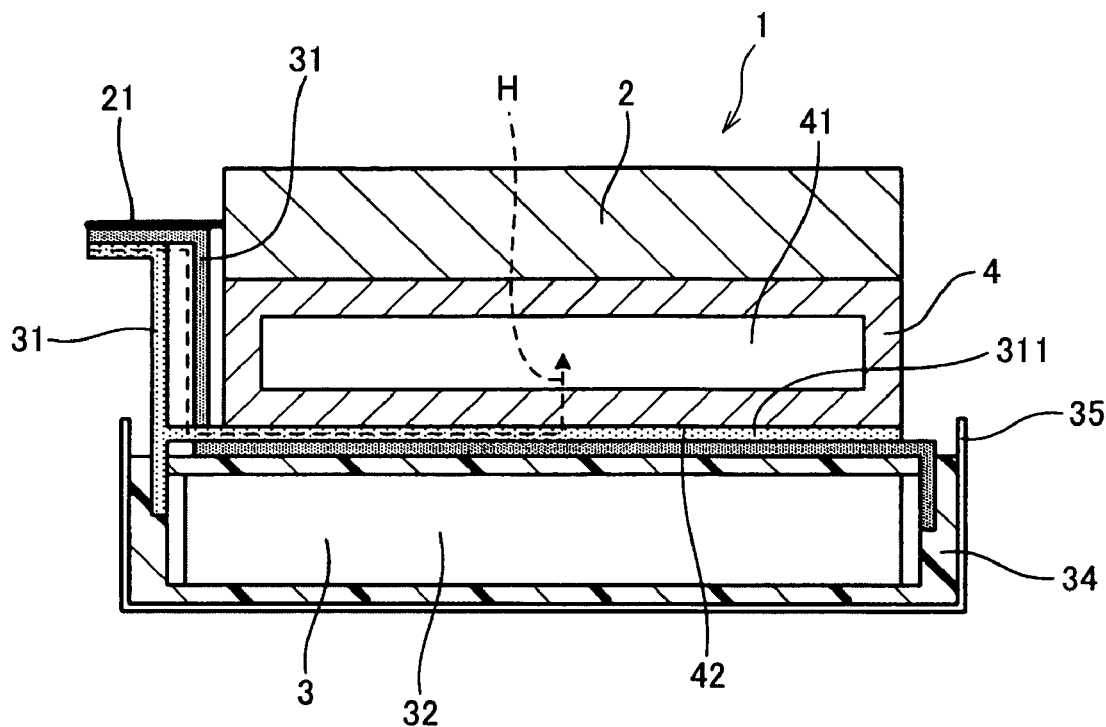
FIG. 4 shows a section diagram of the electric power converter in a second embodiment.

This embodiment is an example of the electric power converter 1 with which the both sides of the pair of the capacitor terminals 31 contact the cooler 4 thermally, as shown in FIG. 4.

In the present embodiment, one of the capacitor terminals 31 in the portion between the connecting portion of the capacitor element 32 and the connecting portion of the semiconductor terminals 21 of the semiconductor module 2, is arranged, like the first embodiment, between the capacitor 3 and the cooler 4 while one of the capacitor terminals 31 contacts the cooler 4 via the insulation material.

Further, a branch part 311 is formed from a portion between the connecting portion of the capacitor element 32 and the connecting portion of the semiconductor terminals 21. The other one of the capacitor terminals 31 is arranged between the capacitor 3 and the cooler 4 while the branch part 311 contacts the cooler 4 via the insulation material.

Other features are the same as those of the first embodiment.

In FIG. 4, by the way, the branch parts 311 of the one of the capacitor terminals 31 and the other one of the capacitor terminals 31 are drawn so that they do not overlap completely in the depth direction of the drawing.

This is a diagrammatic simplification, and in fact, the branch parts 311 of the one of the capacitor terminals 31 and the other one of the capacitor terminals 31 are overlapped in the depth direction. The both branch parts 311 are in contact with the main side 42 of the cooler 4 via the insulation material similarly.

The written method according to above is adopted also in other figures.

In this embodiment, the heat of the semiconductor module 2 can transfer also from the other one of the capacitor terminals 31 to the cooler 4, and the heat receiving of the capacitor 3 can be reduced.

Therefore, more effectively, the heat generation of the capacitor terminals 31 can be suppressed while the heat receiving of the capacitor 3 can be reduced thus the temperature rise in the capacitor 3 can be suppressed.

Further, this embodiment has the same operation and effect as the first embodiment.

(Third Embodiment)

Figure 5:
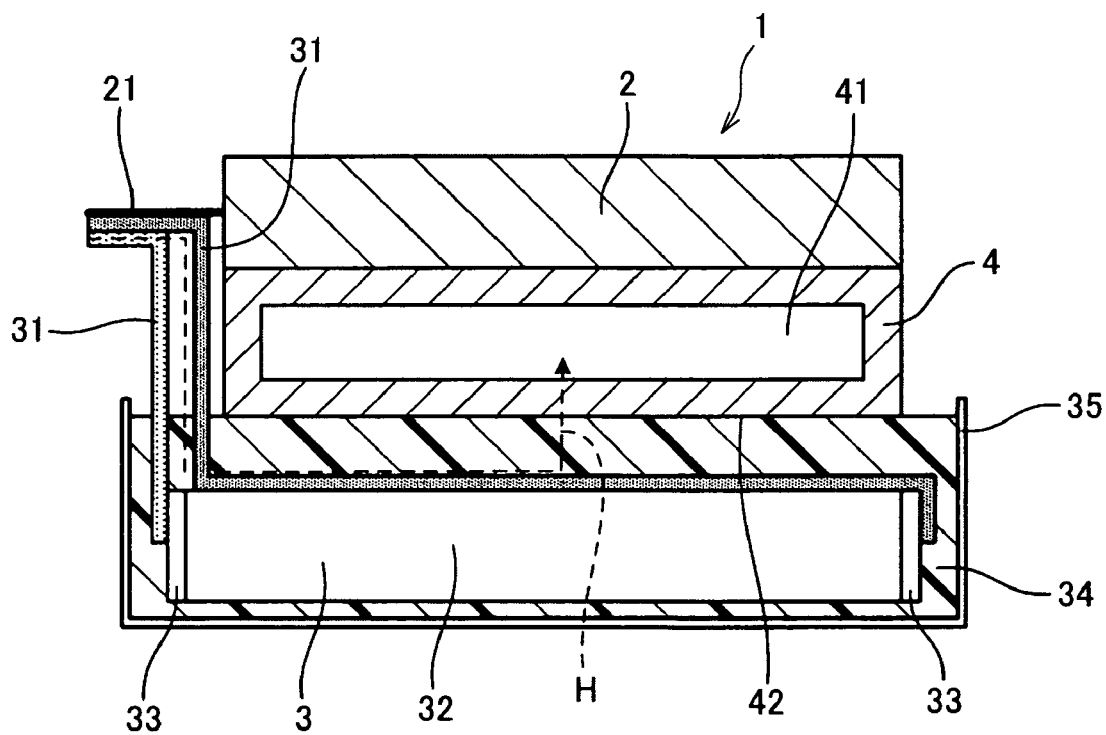
FIG. 5 shows a section diagram of the electric power converter in a third embodiment.
Figure 6:
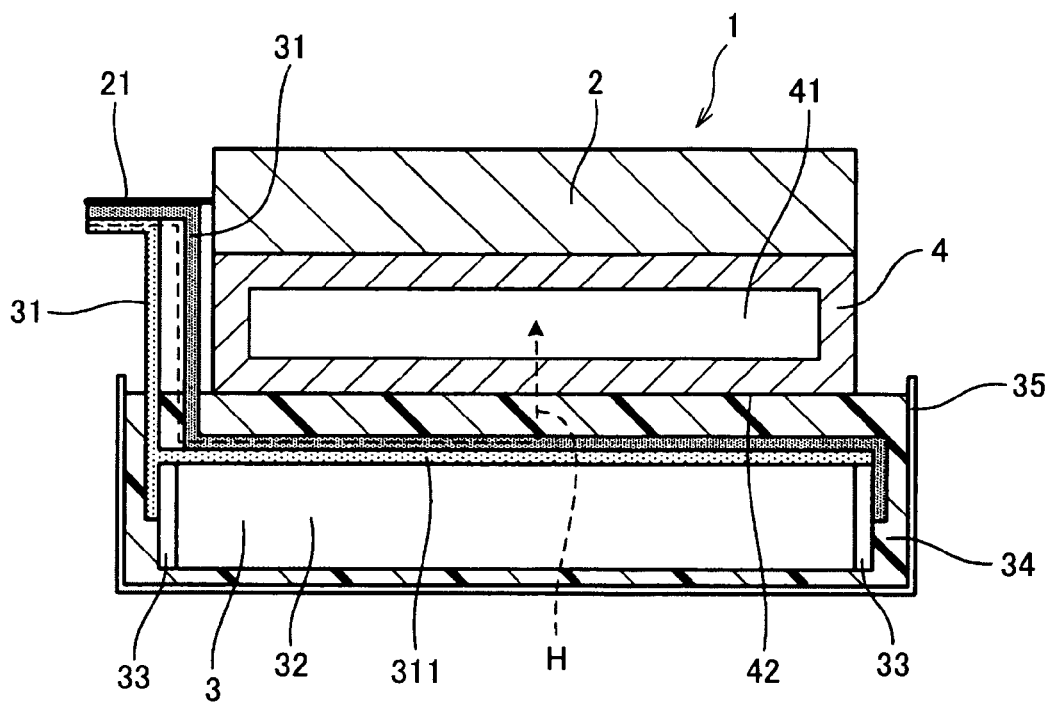
FIG. 6 shows a section diagram of another electric power converter in the third embodiment.

This embodiment is an example of the electric power converter 1 whose capacitor terminals 31 are contacted to the cooler 4 thermally via the potting agents 34 of the capacitor 3, as shown in FIGS. 5 and 6.

The potting agents 34 pack parts of the capacitor terminals 31 together with the capacitor element 32, and the parts of the capacitor terminals 31 thermally contact the cooler 4 via the potting agent 34.

The electric power converter 1 shown in FIG. 5 has only one of the capacitor terminals 31 contacted to the cooler 4 thermally like the first embodiment, while the electric power converter 1 shown in FIG. 6 has both the capacitor terminals 31 contacted to the cooler 4 thermally like the second embodiment.

Other features are the same as those of the first embodiment.

In this embodiment, minimizing the size of the electric power converter 1 can be attained easily.

Further, this embodiment has the same operation and effect as the first embodiment.

(Fourth Embodiment)

This embodiment is an example of the electric power converter 1 using the capacitor 3 having four capacitor terminals 31, 310, as shown in FIGS. 7-10.

In addition to the pair of capacitor terminals 31 for connecting with the semiconductor terminals 21 of the semiconductor module 2, the capacitor 3 in this example has a pair of capacitor terminals 310 for connecting with the buck-boost converter 11 (referring to FIG. 3).

Each capacitor terminal 310 is connected to a pair of electrodes 33 of the capacitor element 32, respectively.

That is, the capacitor terminals 310 are electrically connected directly with the capacitor terminals 31 that are for connecting with the semiconductor module 2.

The present invention is applicable like the embodiments 1-3 even in the electric power converter 1 using the capacitor 3 having four capacitor terminals 31, 310.

Figure 7:
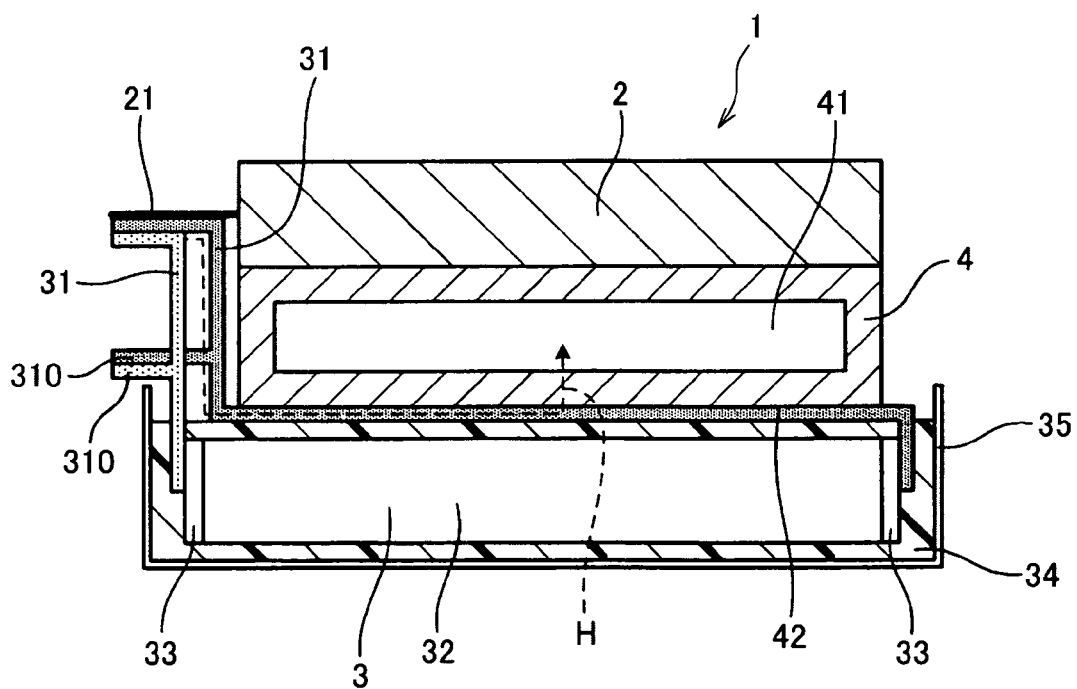
FIG. 7 shows a section diagram of the electric power converter in a fourth embodiment.
Figure 9:
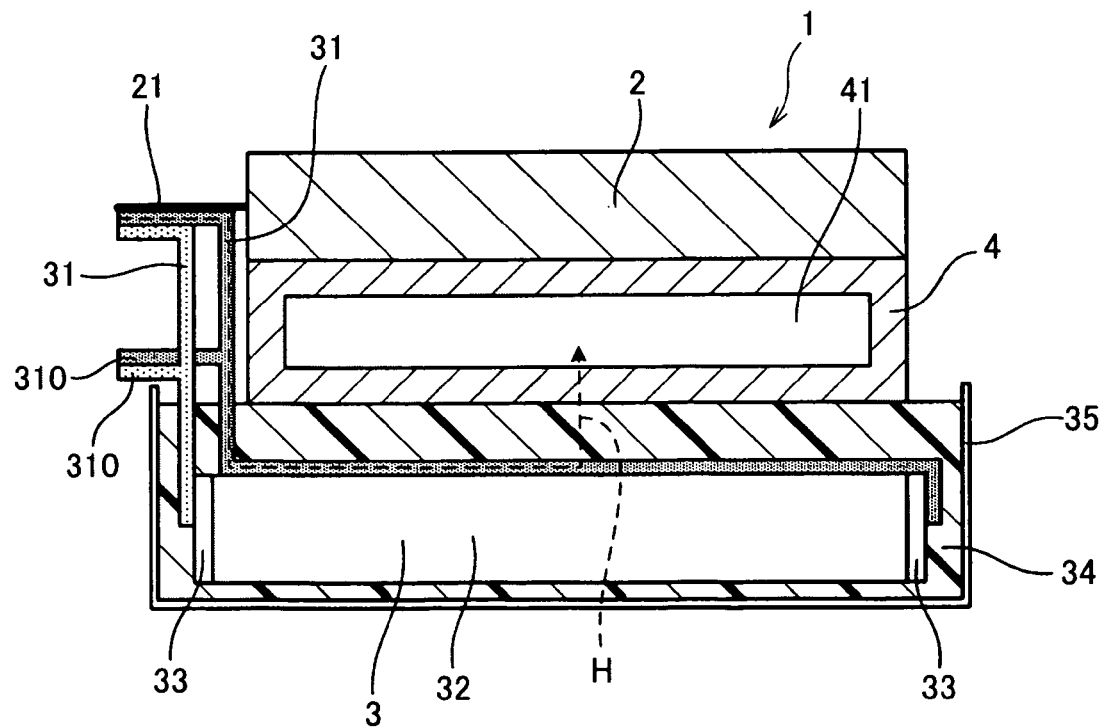
FIG. 9 shows a section diagram of further other electric power converter in the fourth embodiment.

The electric power converter 1 shown in FIGS. 7 and 9 has four capacitor terminals 31, 310 projecting in the same direction, and one of the capacitor terminals 31 contacts the cooler 4 thermally.

Figure 8:
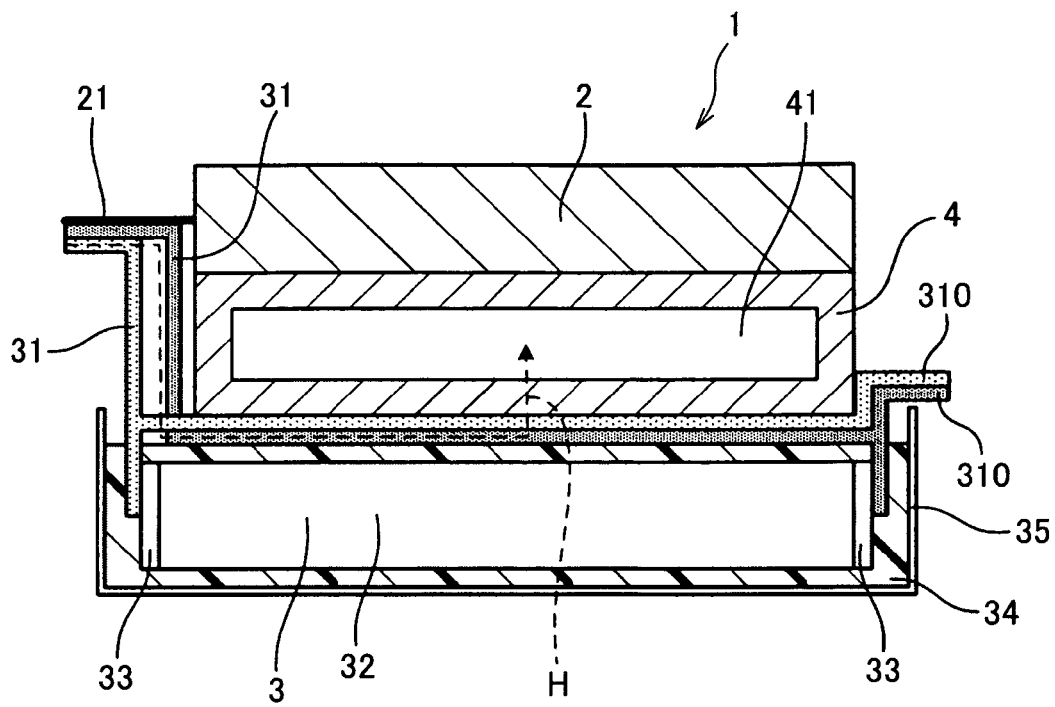
FIG. 8 shows a section diagram of another electric power converter in the fourth embodiment.
Figure 10:
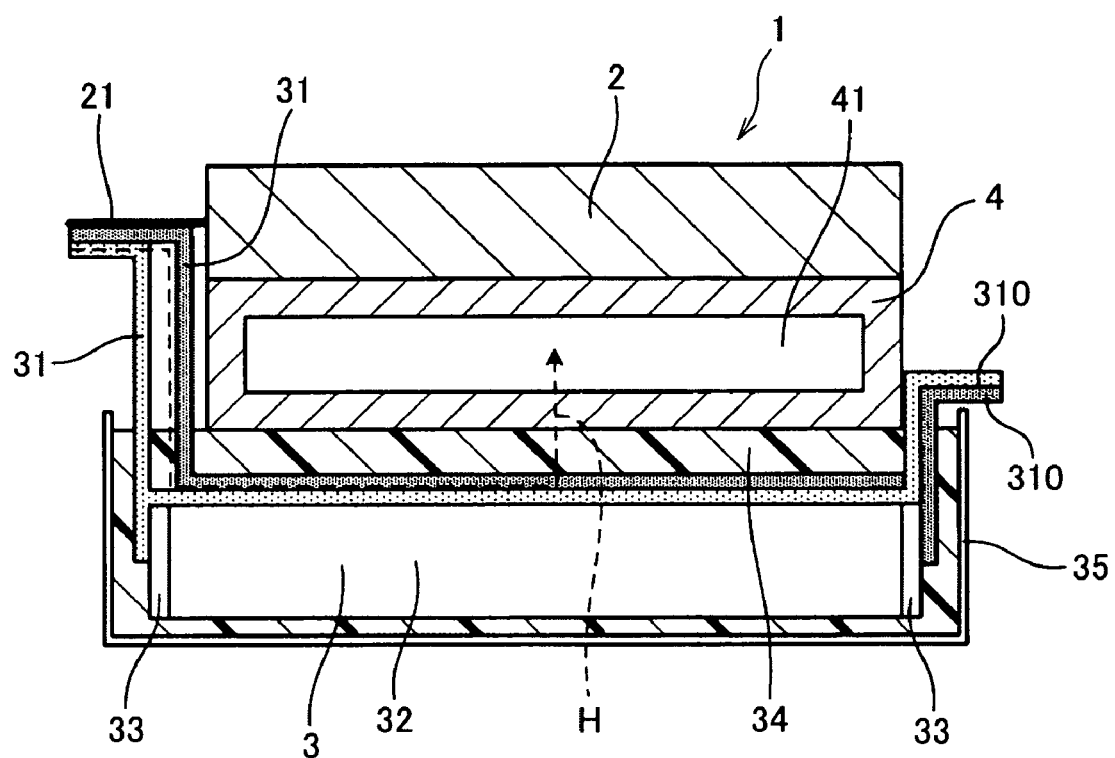
FIG. 10 shows a section diagram of further other electric power converter in the fourth embodiment.

The electric power converter 1 shown in FIGS. 8 and 10 has a pair of capacitor terminals 31 and another pair of capacitor terminals 310 projecting in the opposite direction, and two capacitor terminals 31 contact the cooler 4 thermally.

The electric power converter 1 shown in FIGS. 9 and 10 is an example that the capacitor terminals 31 are contacted to the cooler 4 thermally via the potting agents 34 of the capacitor 3 like the third embodiment.

Other features are the same as those of the first embodiment.

The electric power converter that reduces the temperature rise of the capacitor can also be offered in the present embodiment.

That is, the capacitor terminals 310 can be connected with the capacitor terminals 31 connected directly to the semiconductor module 2, even when the capacitor terminals 310 that are not directly connected to the semiconductor module 2 are newly formed.

Therefore, the heat transfer from the semiconductor module 2 to the capacitor 3 can be reduced, thus the temperature rise in the capacitor 3 can be suppressed, even if any portion of these capacitor terminals 31, 310 are cooled with the cooler 4.

Further, this embodiment has the same operation and effect as the first embodiment.

(Fifth Embodiment)

Figure 11:
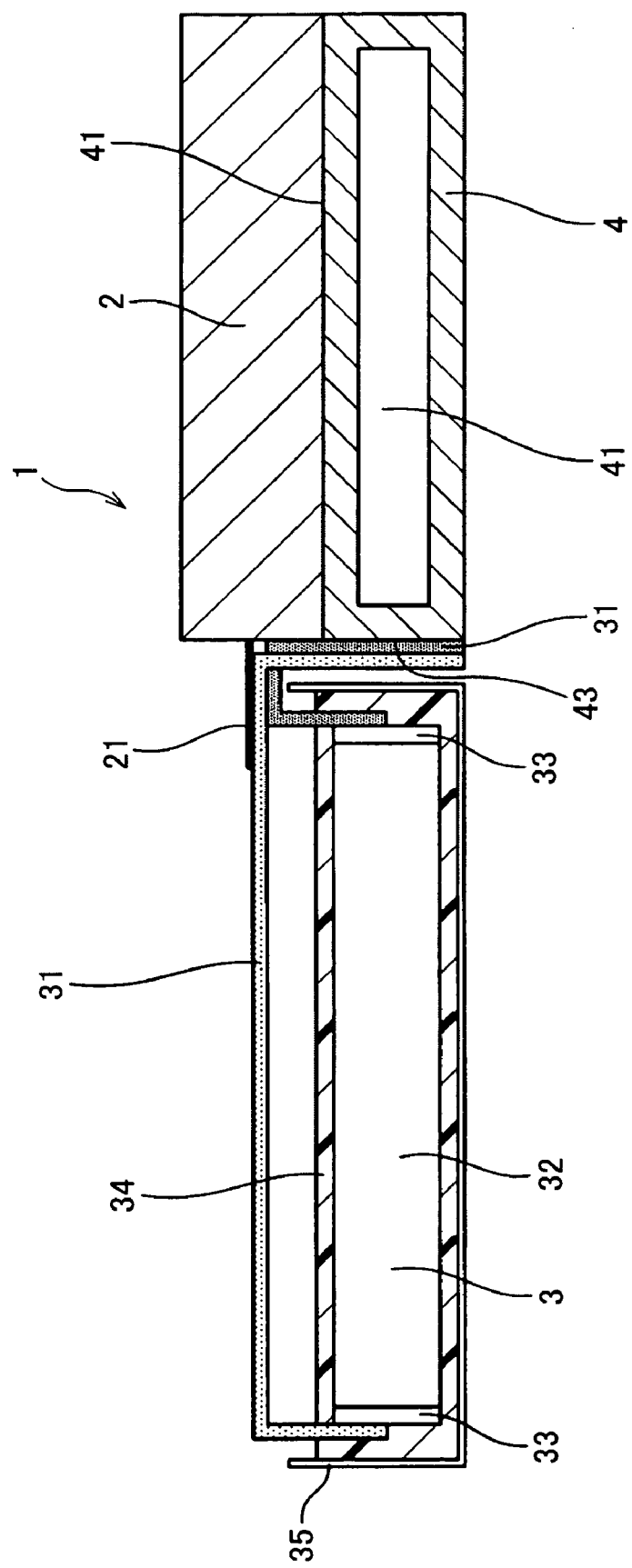
FIG. 11 shows a section diagram of the electric power converter in a fifth embodiment.
Figure 12:
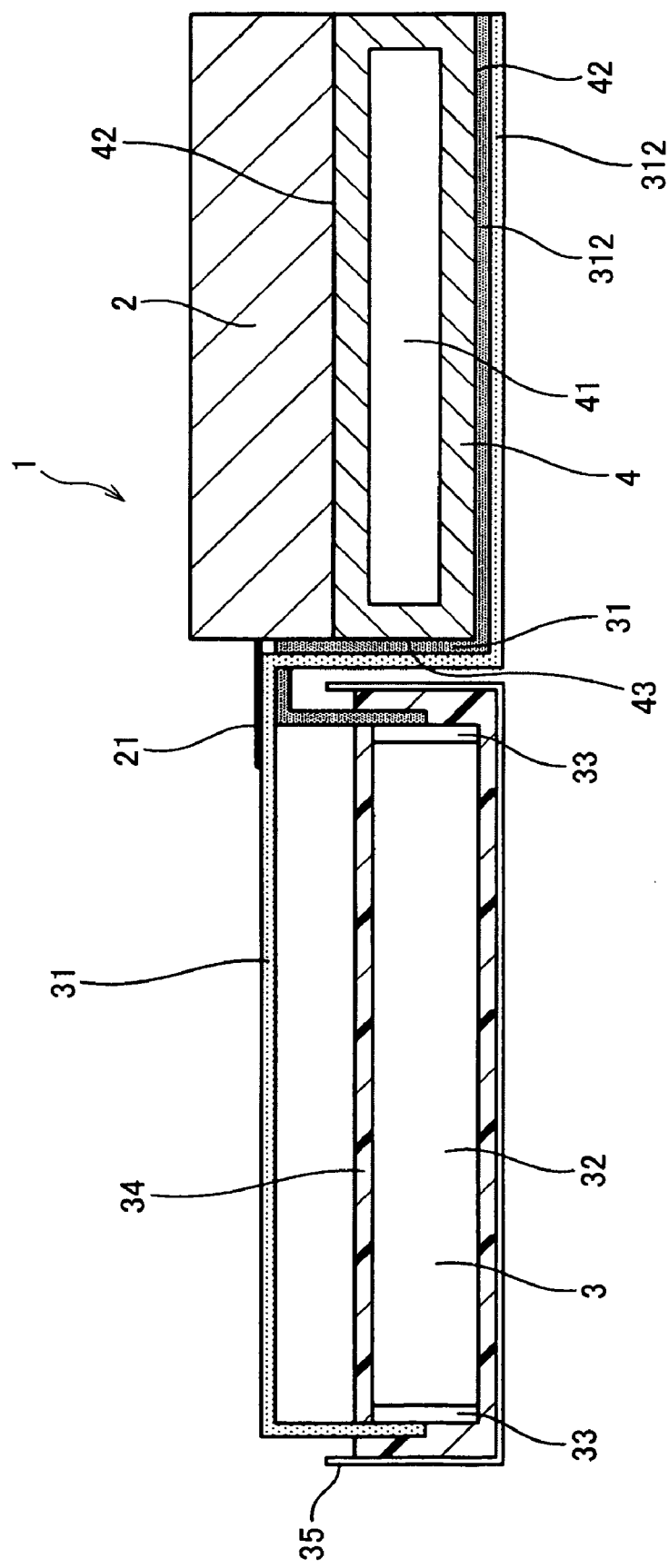
FIG. 12 shows a section diagram of another electric power converter in the fifth embodiment.

This embodiment is an example of the electric power converter 1 that arranges the capacitor 3 in the direction of an end surface 43 that is different from the direction of the main side 42 of the cooler 4, as shown in FIGS. 11 and 12, and has the pair of capacitor terminals 31 contacted to the end surface 43 of the cooler 4 thermally.

In addition, the pair of the capacitor terminals 31 is arranged between the capacitor 3 and the cooler 4.

The capacitor terminals 31 that are thermally contacted to the end surface 43 of the cooler 4 may be bent and extended to form an extension portion 312, as shown in FIG. 12, and this extension portion 312 may be contacted thermally to the main side of the cooler 41 that is in the opposite side of the semiconductor module 2.

Other features are the same as those of the first embodiment.

In the present embodiment, the heat transfer from the semiconductor module 2 to the capacitor 3 can also be reduced, thus the temperature rise in the capacitor 3 can be suppressed.

Further, this embodiment has the same operation and effect as the first embodiment.

(Sixth Embodiment)

Figure 13:
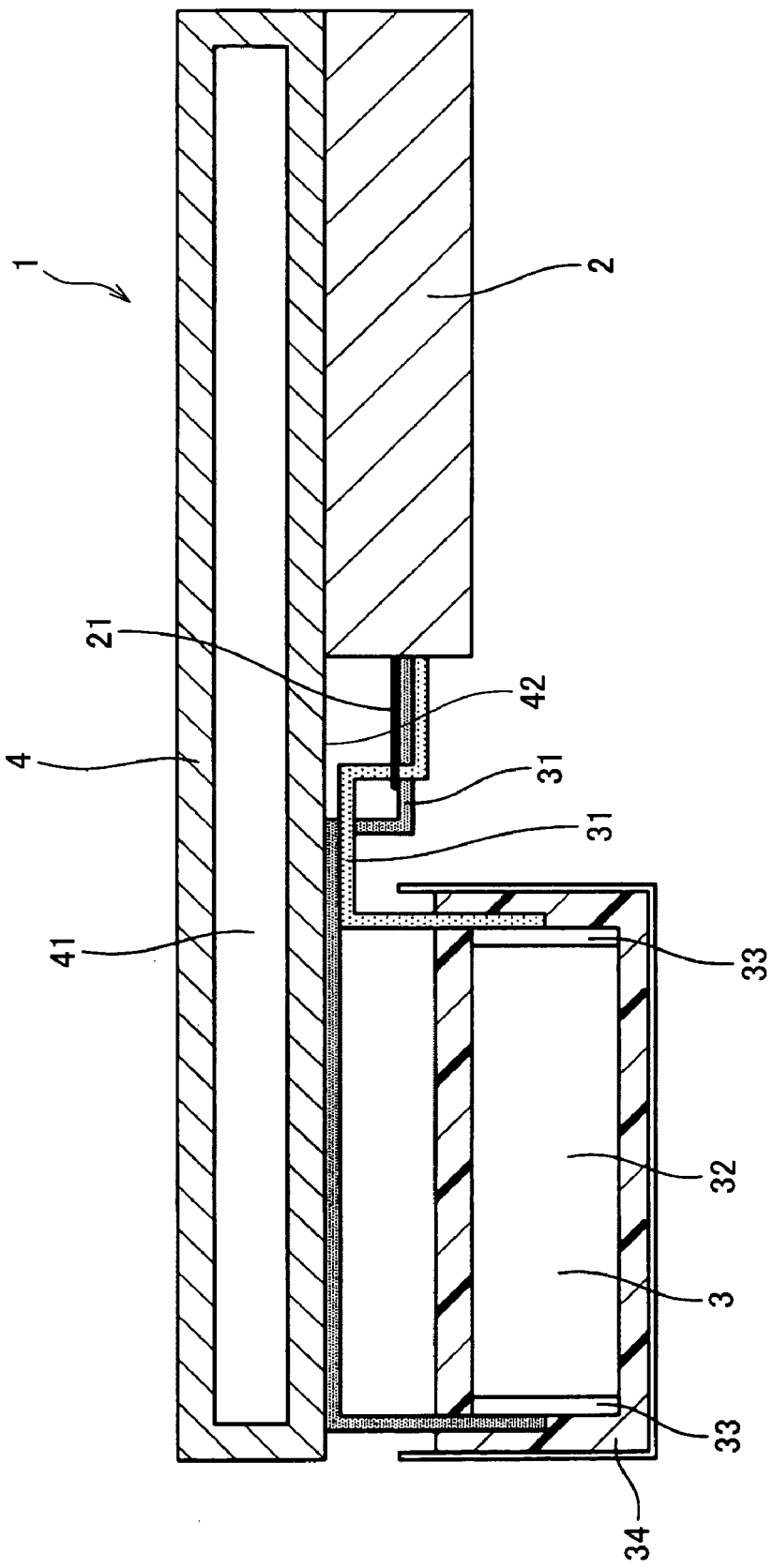
FIG. 13 shows a section diagram of the electric power converter in a sixth embodiment.

As shown in FIG. 13, this embodiment is an example of the electric power converter 1 that arranges the capacitor 3 to the same surface as the main side 42 of the cooler 4, where the semiconductor module 2 is arranged.

The pair of the capacitor terminals 31 contacts the main side 42 of the cooler 4 thermally where the semiconductor module 2 is arranged and contacting thermally.

Other features are the same as those of the first embodiment.

Further, this embodiment has the same operation and effect as the first embodiment.

(Seventh Embodiment)

This embodiment is an example showing that the capacitor terminals 310 and a bus bar (not shown) connected to the terminal of the semiconductor module 2 are connected directly to the pair of electrodes 33 of the capacitor element 32 respectively, as shown in FIGS. 14-17.

In addition, the capacitor terminals 310 are contacted to the cooler 4 thermally while being arranged between the capacitor 3 and the cooler 4. The other end of the capacitor terminals 310 is connected with a terminal 111 of the buck-boost converter 11 (refer to FIG. 3).

Although a concrete arrangement of the semiconductor module 2 and the semiconductor terminals 21 are omitted in FIGS. 14-17, the semiconductor terminals 21 are connected to the capacitor terminals 310 electrically and thermally in a certain way as in FIGS. 1 to 13.

Figure 14:
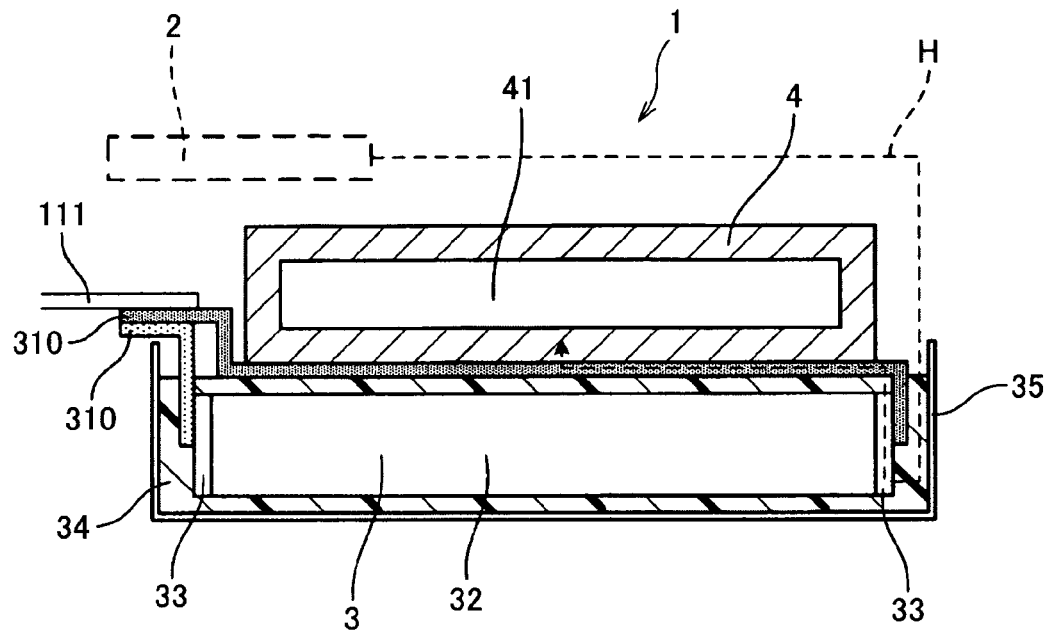
FIG. 14 shows a section diagram of the electric power converter in a seventh embodiment.
Figure 16:
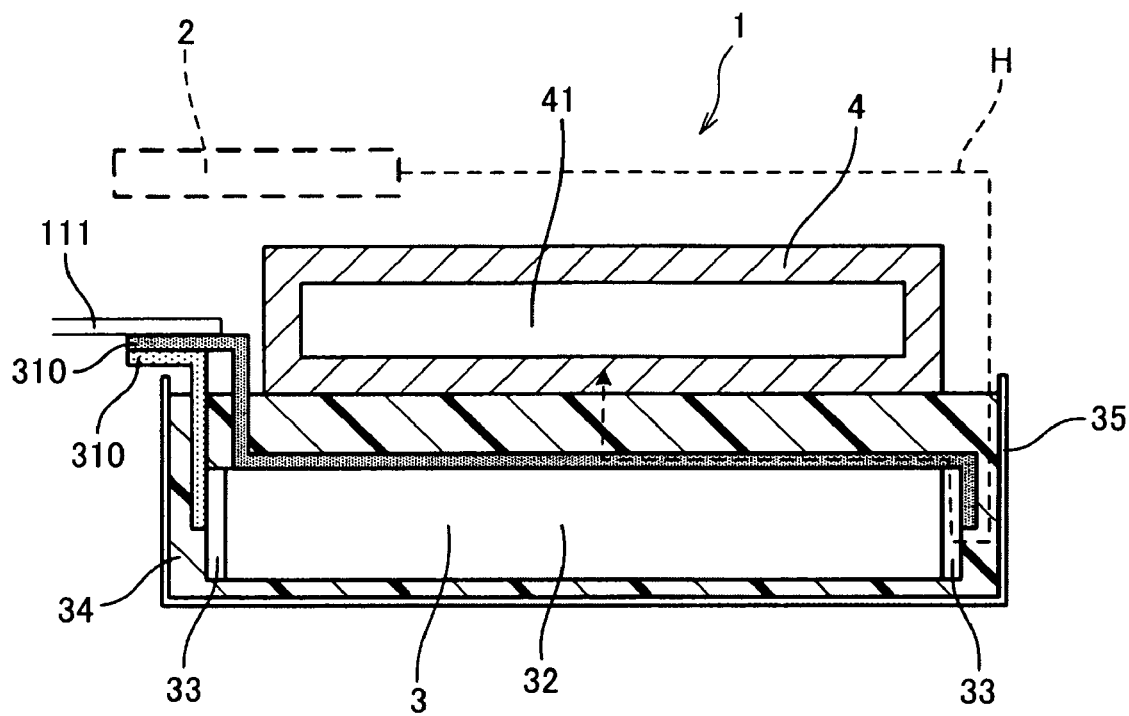
FIG. 16 shows a section diagram of further other electric power converter in the seventh embodiment.

In the electric power converter 1 shown in FIGS. 14 and 16, one capacitor terminal 310 is contacted to the cooler 4 thermally.

Figure 15:
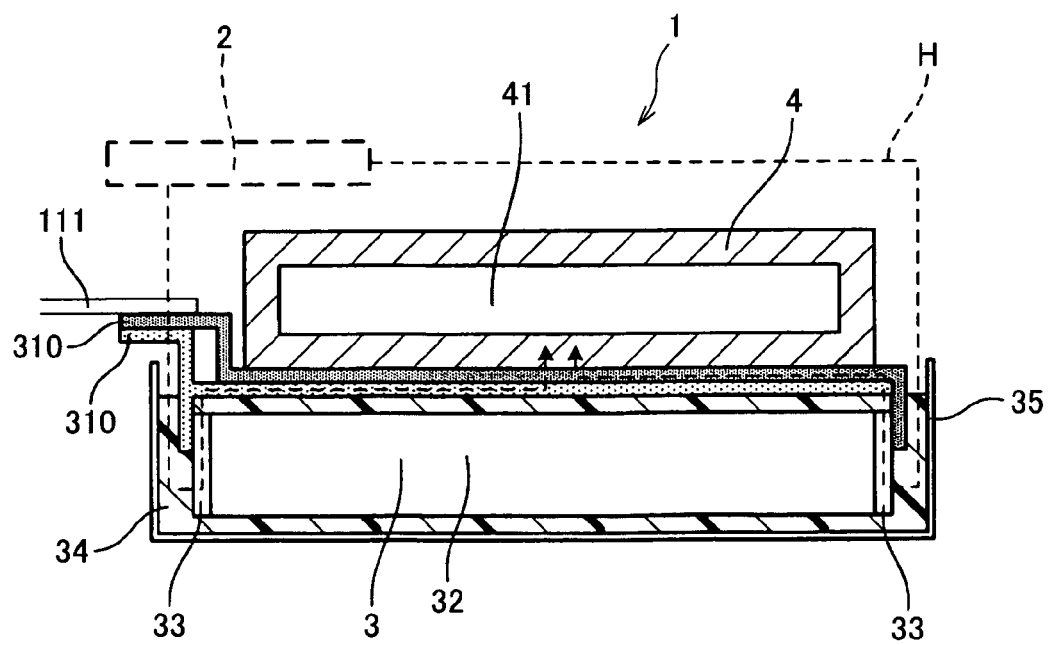
FIG. 15 shows a section diagram of another electric power converter in the seventh embodiment.
Figure 17:
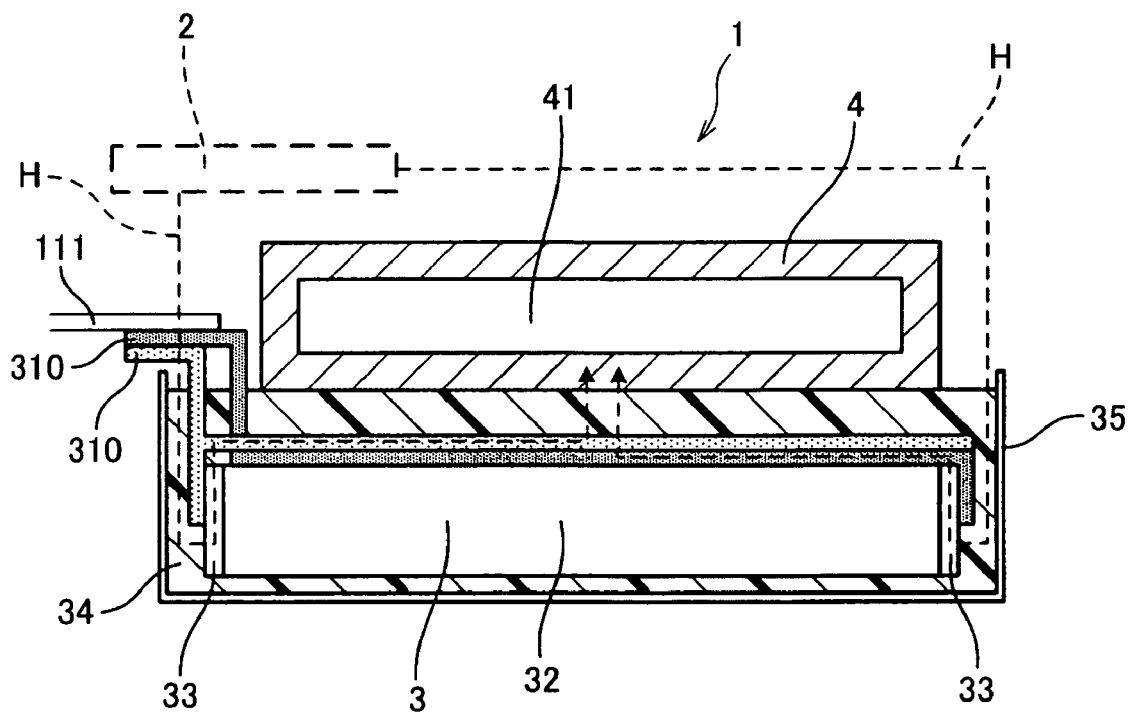
FIG. 17 shows a section diagram of further other electric power converter in the seventh embodiment.

In the electric power converter 1 shown in FIGS. 15 and 17, two capacitor terminals 310 are contacted to the cooler 4 thermally.

Further, in the electric power converter 1 shown in FIGS. 16 and 17, the capacitor terminals 310 are contacted to the cooler 4 thermally via the potting agents 34 of the capacitor 3, like the third embodiment.

In this embodiment, the heat of the semiconductor module 2 will be transferred to the cooler 4 via a bus bar (not shown) that connects the semiconductor module 2 and the electrode 33 of the capacitor 3, the electrode 33 (thermal sprayed portions), and the capacitor terminals 310.

Other features are the same as those of the first embodiment.

Further, this embodiment has the same operation and effect as the first embodiment.

The capacitor terminals 310 may be connected not only to the terminals 111 of the buck-boost converter 11, but to the terminals of the inverter part 12 in this embodiment.

The form of the bus bar, which is connected to exothermic parts other than the semiconductor module 2, directly connected to the pair of electrodes 33 of the capacitor element 32 may also be acceptable.

(Eighth Embodiment)

Figure 18:
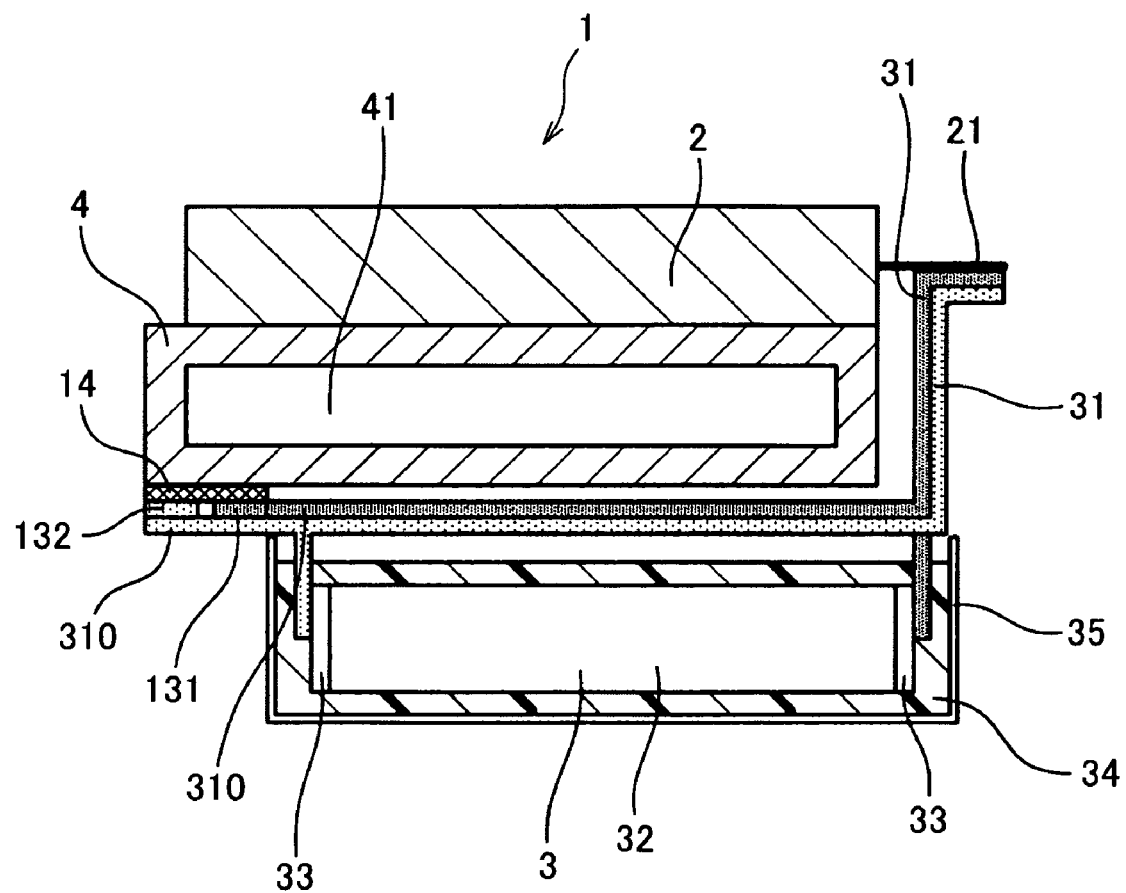
FIG. 18 shows a section diagram of the electric power converter in an eighth embodiment.
Figure 19:
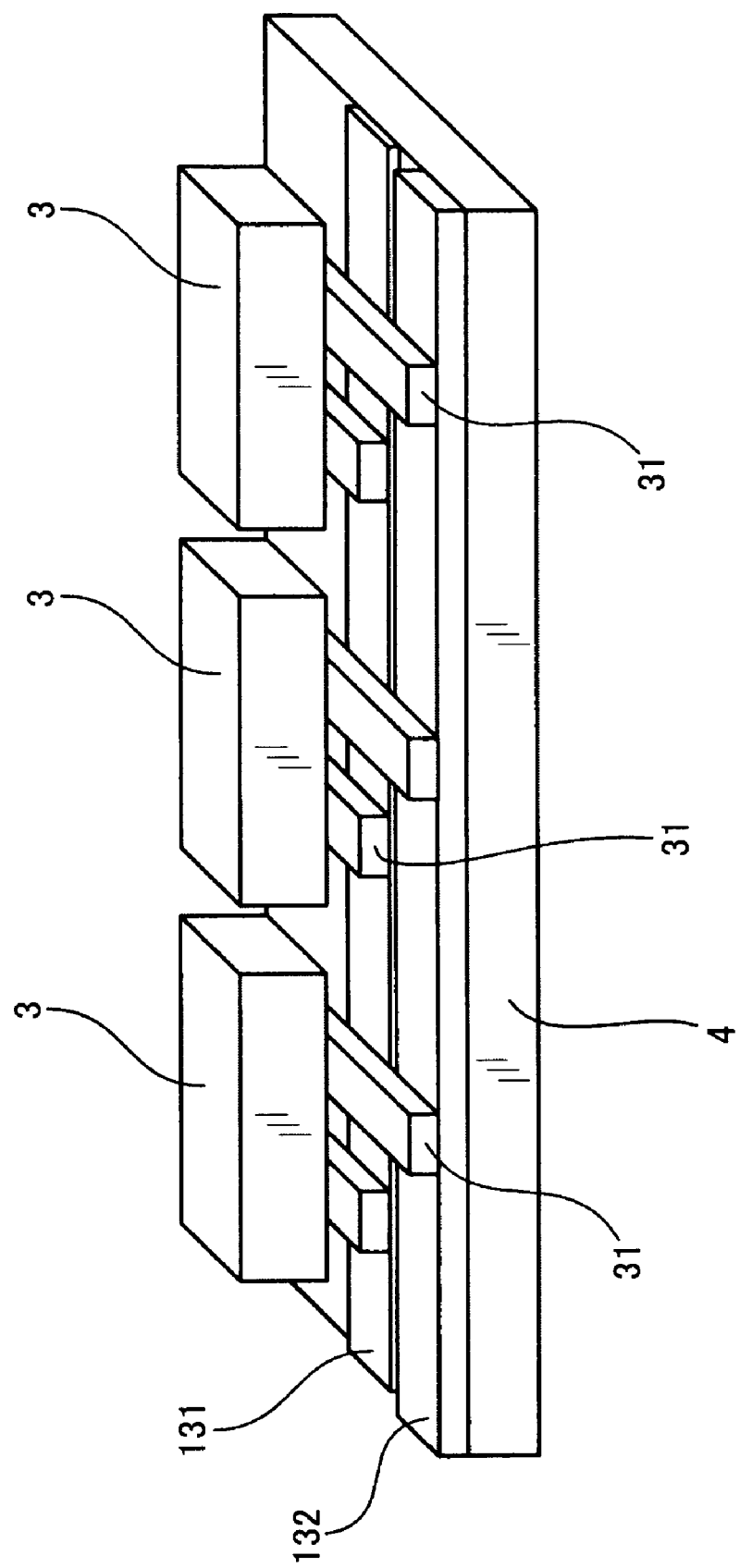
FIG. 19 shows a diagram of a capacitor and an input bus bar in the eighth embodiment.

This embodiment, as shown in FIGS. 18 and 19, is an example of the electric power converter 1 that connects a pair of capacitor terminals 310 to input bus bars 131 and 132 that are connected to the buck-boost converter 11, respectively, and has the input bus bars 131 and 132 contacted to the cooler 4 thermally.

A plurality of capacitors 3 is connected to the input bus bars 131 and 132 in parallel. In addition, the semiconductor module 2 is connected to the each capacitor 3.

The capacitor 3 is arranged at the main side 42 side of the cooler 4 by the opposite side of the semiconductor module 2, and the input bus bars 131 and 132 are fixed to the main side 42 via the insulation material 14.

Other features are the same as those of the first embodiment.

Further, this embodiment has the same operation and effect as the first embodiment.

(Ninth Embodiment)

Figure 20:
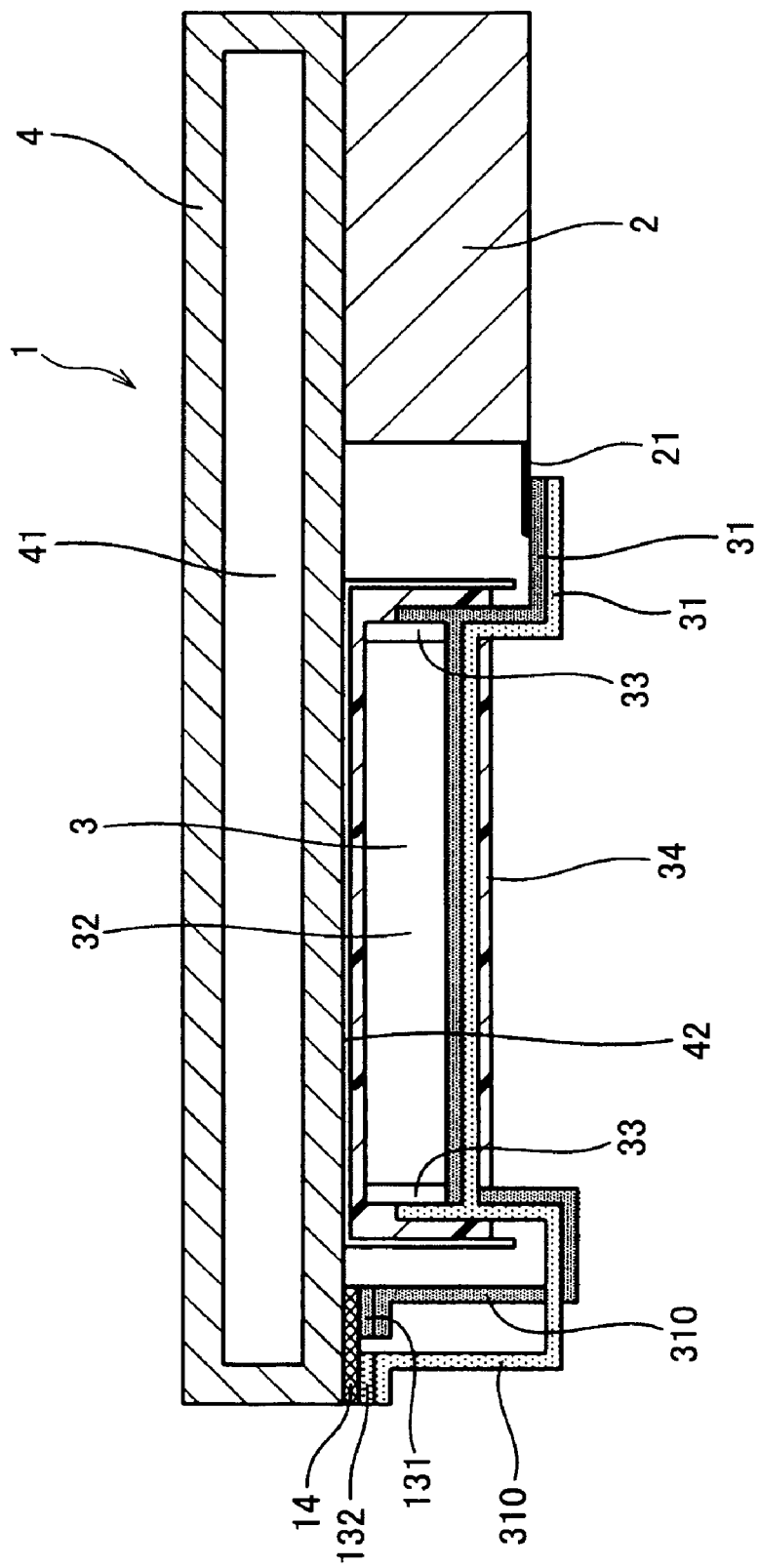
FIG. 20 shows a section diagram of the electric power converter in a ninth embodiment.

This embodiment is an example that arranges the capacitor 3 to the main side 42 of the cooler 4 of the same side as the semiconductor module 2, as shown in FIG. 20. In this embodiment, the main part of the capacitor 3 is also thermally contacted to the cooler 4.

Other features are the same as those of the eighth embodiment.

Further, this embodiment has the same operation and effect as the first embodiment.

(Tenth Embodiment)

Figure 21:
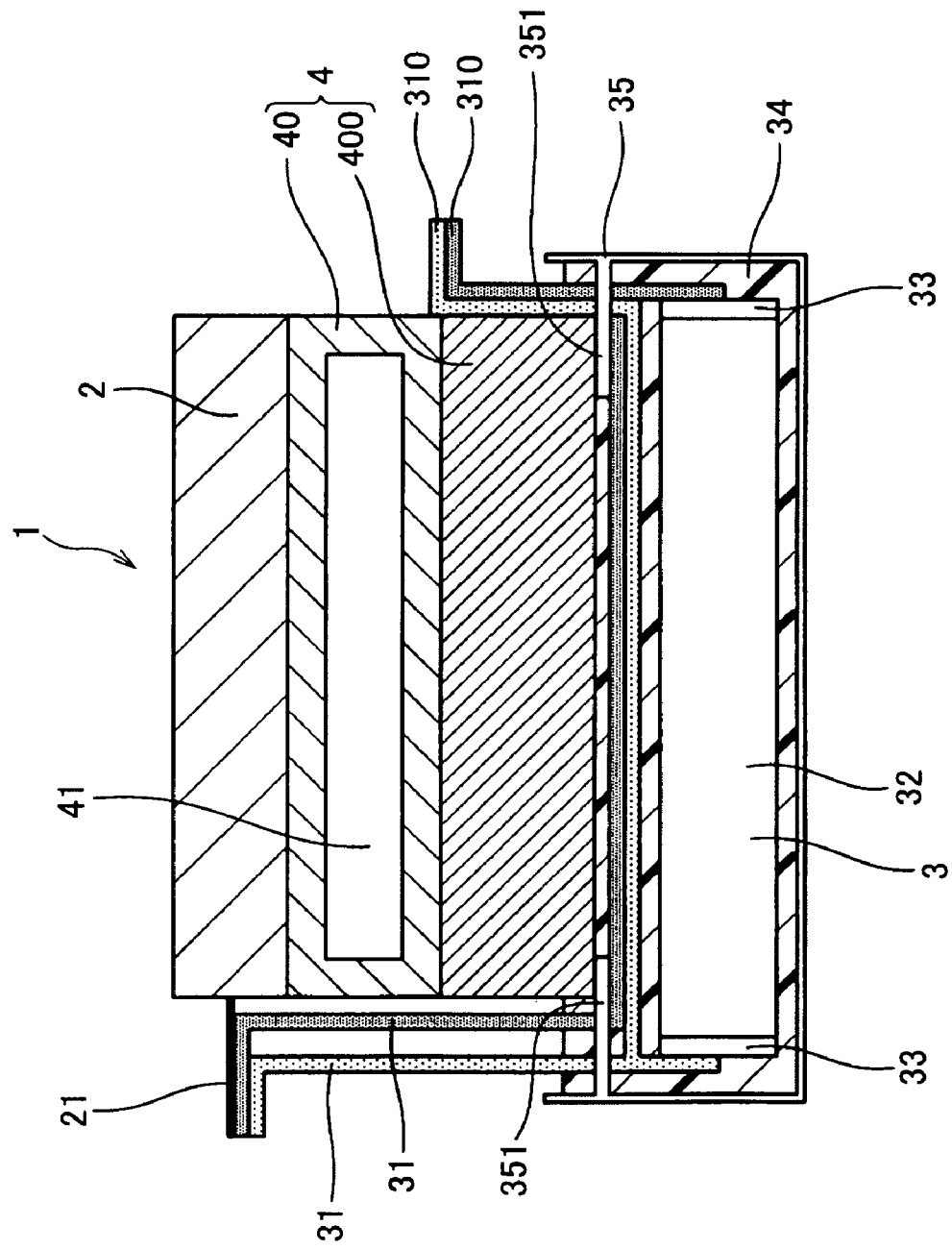
FIG. 21 shows a section diagram of the electric power converter in a tenth embodiment.
Figure 22:
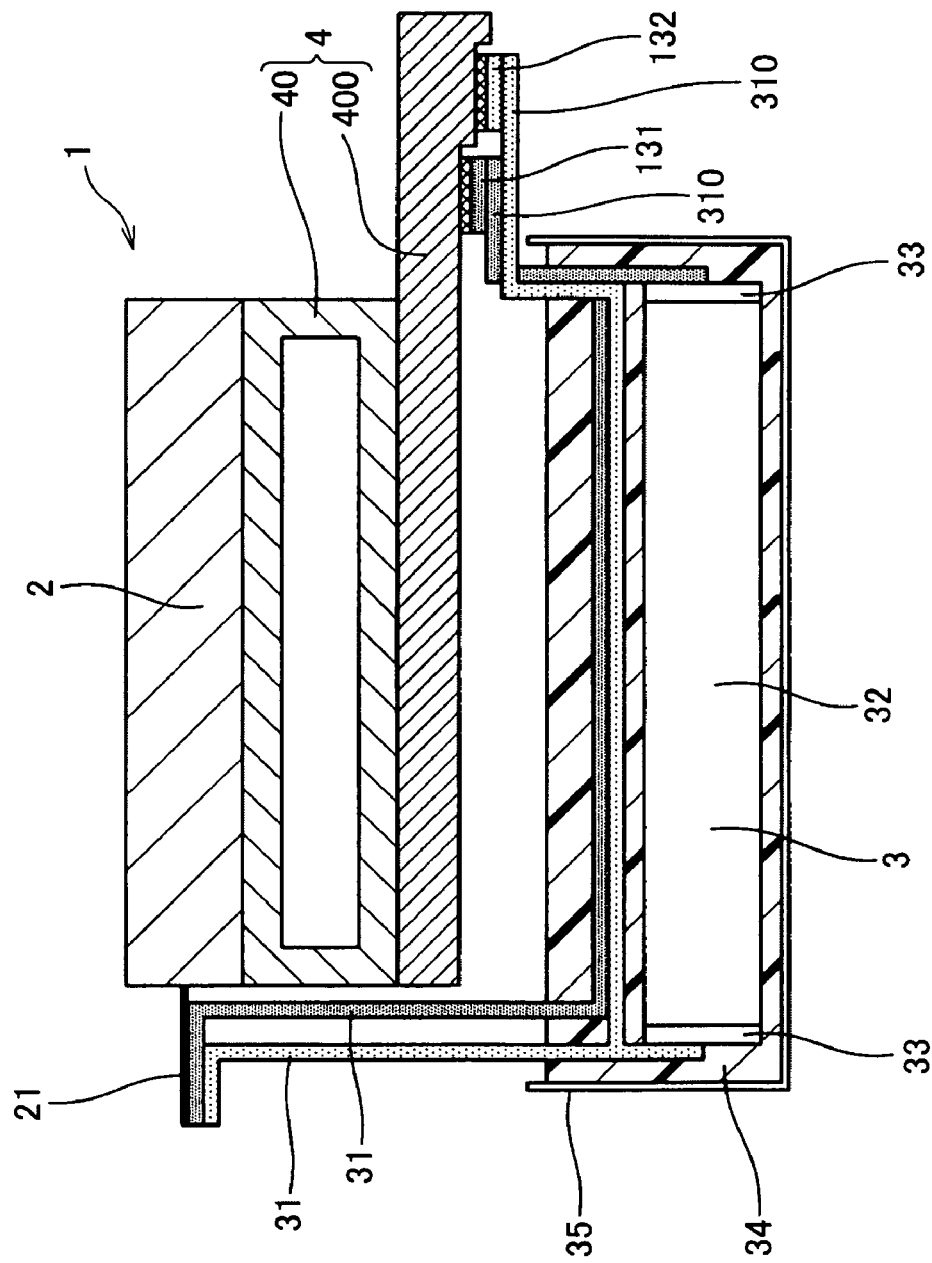
FIG. 22 shows a section diagram of another electric power converter in the tenth embodiment.

This example is an example of the electric power converter 1 that uses the cooler 4 having a cooling pipe 40 that has the refrigerant passage 41, and a heat sink 400 that is arranged tightly contacting to the cooling pipe 40 while not circulate the cooling medium inside, as shown in FIG. 21 and FIG. 22.

The semiconductor module 2 contacts the cooling pipe 40 thermally, and the capacitor terminals 31 touch the heat sink 400 thermally.

The heat sink 400 can be constituted by using a metal excellent in thermal conductivity, such as aluminum or its alloy. Heat dissipation grease may be intervened between the heat sink 400 and the cooling pipe 40.

The electric power converter 1 shown in FIG. 21 has the capacitor terminals 31 contacted to the heat sink 400 thermally via the potting agents 34.

A part of the capacitor terminals 31, with the capacitor element 32, is surrounded by the potting agents 34, and a part of the heat sink 400 is laid under the potting agents 34.

In this electric power converter 1, it should be appreciated that a support part 351 for supporting the heat sink 400 to the case 35 of the capacitor 3 is provided.

Thereby, in laying the part of the heat sink 400 by the potting agents 34, the heat sink 400 can be positioned easily and correctly.

The electric power converter 1 shown in FIG. 22 has the pair of capacitor terminals 31 connected to the input bus bars 131 and 132, which are connected to the buck-boost converter 11, respectively, and has the input bus bars 131 and 132 contacted to the heat sink 400 thermally.

The input bus bars 131 and 132 are fixed to the heat sink 400 via the insulation material 14.

Other features are the same as those of the first embodiment.

In this embodiment, a flexibility of designing the cooler 4 improves, and the nature of assembling parts that constitute the electric power converter 1 can be raised as well.

Further, in the electric power converter 1 shown in FIG. 21, the heat sink 400 integrated with the capacitor 3 beforehand can be tightly contacted to the cooling pipe 40 when assembling.

Further, this embodiment has the same operation and effect as the first embodiment.

(Eleventh Embodiment)

Figure 23:
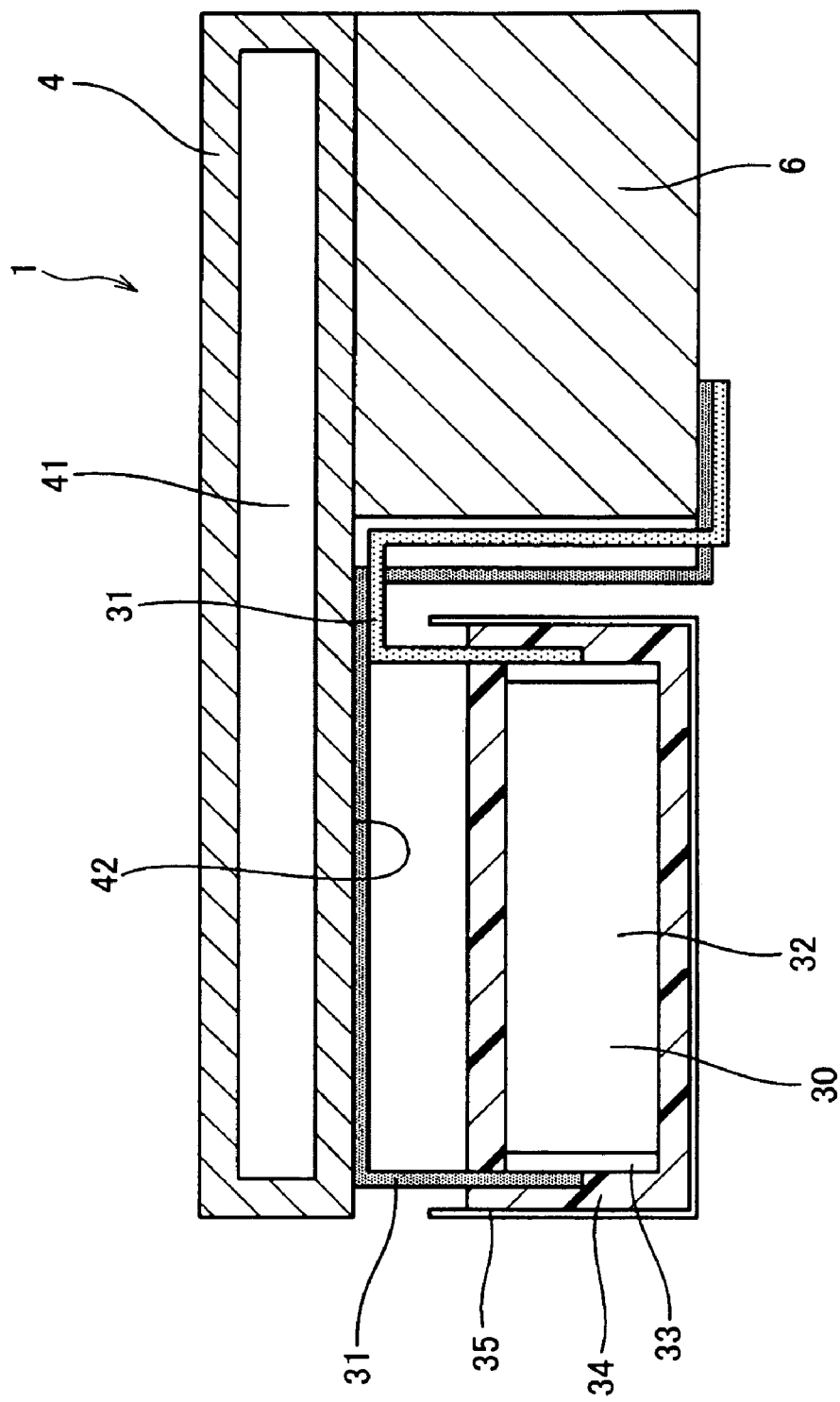
FIG. 23 shows a section diagram of the electric power converter in an eleventh embodiment.

This embodiment is an example of the electric power converter 1 in which the capacitor 30 is connected with an electronic component, a reactor 6 in this embodiment, that the capacitor terminals 31 are connected to the cooler 4 thermally, as shown in FIG. 23.

As shown in FIG. 3, in the electric power converter 1, the capacitor 30 for absorbing the ripple of the direct-current power supply 52 is provided between the direct-current power supply 52 and the buck-boost converter 11.

One of the terminals of the capacitor 30 is connected to the reactor 6 that constitutes the buck-boost converter 11. The reactor 6 is also an exothermic part and there is a possibility that the capacitor 30 may receive heat from the reactor 6.

Then, as shown in FIG. 23, by thermally contacting the capacitor terminals 31 connected with the reactor 6 to the cooler 4, heat generated by the capacitor terminals 31 can be suppressed, and heat received by the capacitor 30 from the reactor 6 can also be suppressed, thus the temperature rise of the capacitor 30 can be reduced.

The arrangement is not limited as shown in FIG. 23, but various forms, such as replacing the semiconductor module 2 in the embodiments 1-10 to the reactor 6 for the electronic component, can be taken.

In addition, the semiconductor module 2 can also be arranged contacting the same cooler 4 together with the reactor 5.

What is claimed is:

1. An electric power converter comprising:
   a capacitor electrically connected to either a semiconductor module or a reactor that contains a semiconductor element therein; and
   a cooler that is in thermal contact with either the semiconductor module or the reactor;
   wherein,
   at least one of a plurality of capacitor terminals provided in the capacitor is arranged between the cooler and the capacitor, and the capacitor terminal contacts the cooler thermally in a state where the capacitor terminal is sandwiched between the cooler and the capacitor,
   the capacitor terminal that contacts the cooler thermally is a terminal connected to the semiconductor module or the reactor,
   the capacitor terminal that contacts the cooler thermally is a terminal connected to an electronic components different from the semiconductor module or the reactor,
   the capacitor terminal are connected to a pair of electrodes disposed in the capacitor, and
   at least one of the capacitor terminals thermally contact the cooler in the state of being arranged between the cooler and the capacitor at a position between a portion connected to the semiconductor module or the reactor and a portion connected to the electrodes.

2. The electric power converter according to claim 1, wherein,
   the cooler contacts the semiconductor module or the reactor thermally.

3. The electric power converter according to claim 1, wherein,
   potting agents pack parts of the capacitor terminals together with a capacitor element, and
   the parts of the capacitor terminals thermally contact the cooler via the potting agent.

4. The electric power converter according to claim 1, wherein,
   at least a part of a pair of capacitor terminals is adjacent to each other.

5. The electric power converter according to claim 1, wherein,
   the cooler has a refrigerant passage that circulates a cooling medium therein.

6. The electric power converter according to claim 5, wherein,
   the cooler comprises a cooling pipe that has the refrigerant passage, and
   a heat sink that is arranged tightly contacting to the cooling pipe while not circulating the cooling medium therein.

7. The electric power converter according to claim 6, wherein,
the semiconductor module or the reactor thermally contacts the cooling pipe, and at least one of the capacitor terminals touches the heat sink thermally.

8. The electric power converter according to claim 6, wherein,
a part of the capacitor terminals, with the capacitor element, is surrounded by potting agents,
a part of the heat sink is embedded under the potting agents, and
a part of the capacitor terminals thermally contacts the heat sink via the potting agents.

9. An electric power converter comprising:
a capacitor electrically connected to either a semiconductor module or a reactor that contains a semiconductor element therein; and
a cooler that is in thermal contact with either the semiconductor module or the reactor;
wherein,
at least one of a plurality of capacitor terminals provided in the capacitor is arranged between the cooler and the capacitor, and the capacitor terminal contacts the cooler thermally,
the capacitor terminal that contacts the cooler thermally is a terminal connected to the semiconductor module or the reactor,
the capacitor terminal that contacts the cooler thermally is a terminal connected to an electronic components different from the semiconductor module or the reactor,
the capacitor terminal are connected to a pair of electrodes disposed in the capacitor,
at least one of the capacitor terminals thermally contact the cooler in the state of being arranged between the cooler and the capacitor at a position between a portion connected to the semiconductor module or the reactor and a portion connected to the electrodes,
the cooler has a refrigerant passage that circulates a cooling medium therein,
the cooler comprises a cooling pipe that has the refrigerant passage,
a heat sink that is arranged tightly contacting to the cooling pipe while not circulating the cooling medium therein,
a part of the capacitor terminals, with the capacitor element, is surrounded by potting agents,
a part of the heat sink is embedded under the potting agents, and
a part of the capacitor terminals thermally contacts the heat sink via the potting agents.

* * * * *